(12) United States Patent
Cok et al.

(10) Patent No.: US 6,881,946 B2
(45) Date of Patent: Apr. 19, 2005

(54) TILED ELECTRO-OPTIC IMAGING DEVICE

(75) Inventors: Ronald S. Cok, Rochester, NY (US); Michael E. Miller, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 110 days.

(21) Appl. No.: 10/174,596

(22) Filed: Jun. 19, 2002

(65) Prior Publication Data

US 2003/0234343 A1 Dec. 25, 2003

(51) Int. Cl.[7] ............................................. H01L 27/00
(52) U.S. Cl. .............................. 250/208.6; 250/208.1; 345/1.3; 348/302
(58) Field of Search .......................... 257/257–258, 257/443–448; 348/294, 302, 273–276, 383; 250/208.1, 208.6, 214.1, 370.09; 385/115–120; 345/1.1, 1.3, 4, 903; 349/73, 74

(56) References Cited

U.S. PATENT DOCUMENTS

| 4,299,447 | A | | 11/1981 | Soltan et al. |
| 4,695,716 | A | * | 9/1987 | Tandon et al. ............ 250/214.1 |
| 5,369,281 | A | * | 11/1994 | Spinnler et al. ....... 250/370.09 |
| 5,572,034 | A | | 11/1996 | Karellas |
| 5,801,797 | A | | 9/1998 | Iida et al. |
| 5,903,328 | A | | 5/1999 | Greene et al. |
| 6,035,013 | A | * | 3/2000 | Orava et al. .................. 378/37 |
| 6,262,696 | B1 | | 7/2001 | Seraphim et al. |
| 6,370,019 | B1 | | 4/2002 | Matthies et al. |
| 6,385,430 | B1 | * | 5/2002 | Jackson et al. ............. 399/371 |
| 6,479,827 | B1 | * | 11/2002 | Hamamoto et al. ..... 250/370.11 |
| 6,498,592 | B1 | * | 12/2002 | Matthies ..................... 345/1.1 |
| 6,559,910 | B1 | * | 5/2003 | Suzuki et al. ................. 349/95 |
| 2002/0018151 | A1 | | 2/2002 | Suzuki et al. |

FOREIGN PATENT DOCUMENTS

| EP | 0 491 662 | 6/1992 |
| JP | 63-142330 | 6/1988 |
| WO | WO 99/41732 | 8/1999 |

* cited by examiner

Primary Examiner—Thanh X. Luu
Assistant Examiner—Stephen Yam
(74) Attorney, Agent, or Firm—Andrew J. Anderson; Thomas H. Close

(57) ABSTRACT

A tiled electro-optic imaging device includes two or more tiles each tile having a two dimensional array of pixels and at least one non-linear edge, the tiles being aligned edge to edge such that pixels from the tiles are inter-digitated along the non-linear edge, whereby the visibility of the non-linear edge is reduced and the visual uniformity of the device is enhanced.

30 Claims, 8 Drawing Sheets

TILED ELECTRO-OPTIC IMAGING DEVICE

FIELD OF THE INVENTION

The present invention relates to tiled electro-optic imaging devices such as displays and image sensors and, more particularly, to improving the visual appearance of such devices.

BACKGROUND OF THE INVENTION

It is known to increase the size of an electro-optic imaging device such as a flat panel display or an image sensor by forming the device using a plurality of tiles, each tile having a two dimensional array of pixels; see for example U.S. Pat. No. 6,262,696 issued Jul. 17, 2001 to Seraphim et al. Large tiled displays can also be made using an array of fiber optic panels in association with smaller displays. The fiber optic panels reduce the edge gap between the display tiles as described in U.S. Pat. No. 4,299,447 issued Nov. 10, 1981 to Soltan et al. WO 99/41732, Matthies et al., published Aug. 19, 1999, describes forming a tiled display device from display tiles having pixel positions defined up to the edge of the tiles. One example of the use of tiles to increase the size of an image sensor is shown in U.S. Pat. No. 5,572,034, issued Nov. 5, 1996 to Karellas.

However, construction of tiled imaging devices is difficult. No two tiles, whether used alone or with fiber optic face plates, are precisely alike and the human eye is extremely sensitive to differences in color, brightness, and contrast in localized areas. There are calibration techniques by which the uniformity and color balance of a display or image sensor tile can be adjusted, but these are difficult, require re-adjustment over time, and are often inadequate. Moreover, the seams between the tile edges are very noticeable as the human eye is very sensitive to straight horizontal and vertical lines.

The assembly of flat-panel tiles is also a problem. In order to ameliorate the problems associated with tile seams, the tiled displays must be assembled very carefully and with great precision. This process is expensive and slow and products are prone to fall out of alignment over time without expensive forms or brackets to align the tiles once they are placed.

There is a need therefore for a tiled electro-optic imaging device that reduces the visibility of tile non-uniformities and tile seams, and that enhances the mechanical assembly of the tiles.

SUMMARY OF THE INVENTION

The need is met according to the present invention by providing a tiled electro-optic imaging device that includes two or more tiles, each tile having a two dimensional array of pixels and at least one non-linear edge, the tiles being aligned edge to edge such that pixels from the tiles are inter-digitated along the non-linear edge, whereby the visibility of the non-linear edge is reduced and the visual uniformity of the device is enhanced.

ADVANTAGES

The present invention has the advantage that it decreases the visibility of tile seams, increases the apparent uniformity of the tiles, and facilitates the mechanical alignment of the tiles in the electro-optic imaging device.

DETAILED DESCRIPTION OF THE INVENTION

Figure 1:
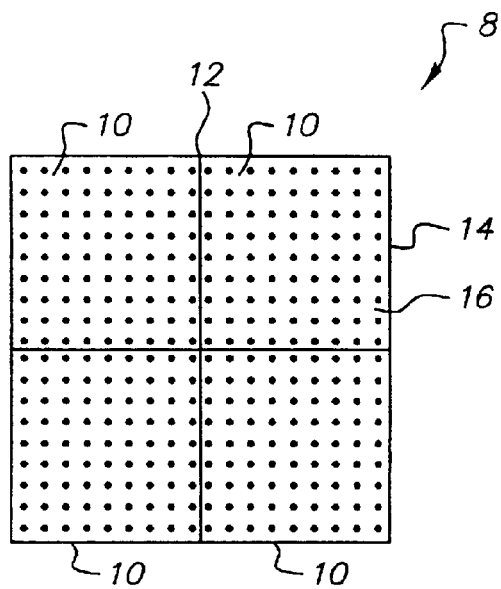
FIG. 1 is a schematic diagram of a prior art tiled electro-optic imaging device.

Referring to FIG. 1, a prior art tiled electro-optic imaging device (display or image sensor) 8 includes a two-by-two array of tiles 10, having edges 14 and an array of pixels 16. The edges 14 of the tiles 10 are aligned to produce a seam 12 between the edges of the tiles 14 and the last row or column of pixels 16 in the arrays. (The illustration of FIG. 1 is not drawn to scale to clarify the description). The edge seam 12 can be very visible to the human eye because it is straight, is horizontal or vertical, and has a direction that is the same as the pixel rows and columns. Moreover, small differences between the tiles, for example color, brightness, sensitivity or noise can be very visible to the human eye. According to the present invention, the perceived performance of the imaging device is improved by making the tile edges non-linear such that pixels from adjacent tiles are inter-digitated along the non-linear edge, whereby the visibility of the non-linear edge is reduced and the visual uniformity of the device is enhanced. Moreover, the inter-digitation of the edges facilitates mechanical alignment of the tiles in the device.

Figure 2:
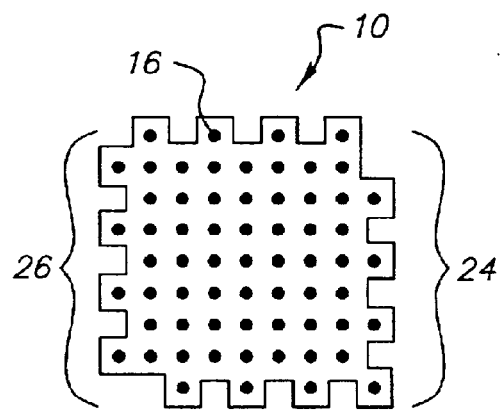
FIG. 2 is a schematic diagram showing the outline of a tile of an electro-optic imaging device according to one embodiment of the present invention.
Figure 3:
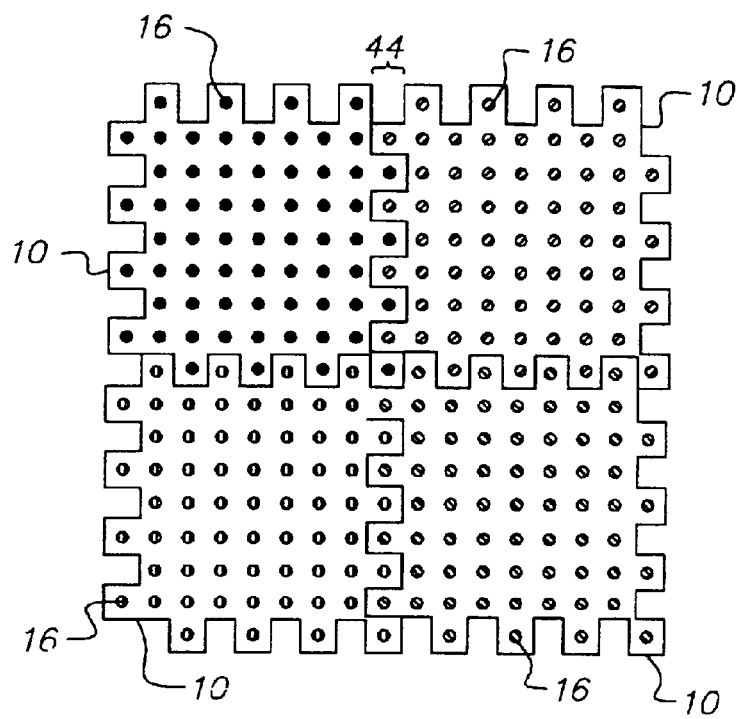
FIG. 3 is a schematic diagram of a tiled electro-optic imaging device according to one embodiment of the present invention.

Referring to FIG. 2, a tile having an edge structure according to one embodiment of the present invention is shown. In FIG. 2, the four edges of tile 10 are non-linear and the rows and columns of pixels 16 have a stepped pattern. Moreover, the pixel rows and columns on the opposing edges 24 and 26 of each tile have a complementary form such that the rows and columns on each tile edge can be inter-digitated as shown in FIG. 3. Referring to FIG. 3, four of the tiles 10 are arranged to form a regular array of pixels 16 with the result that pixels at the edges of the tiles are inter-digitated. This inter-digitation of the pixels at the tile edges has multiple benefits. First, the tile seam is less visible to the human eye because it is not straight, thus reducing the visibility of tile seams. Second, the inter-digitation of pixels from two adjacent tiles obscures differences in uniformity between the tiles. Third, the edges of the tiles can no longer slip with respect to each other because the stepped shape of the edge locks the tiles in position with respect to each other. Moreover, the tiles are easier to assemble into a device since they lock into a specific location with respect to each other.

Figure 4:
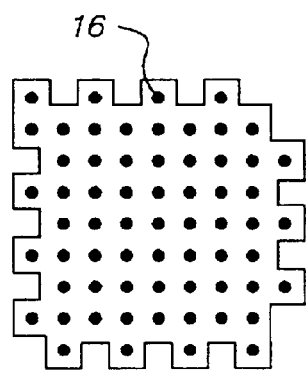
FIG. 4 is a schematic diagram showing the outline of a tile of an electro-optic imaging device according to an alternative embodiment of the present invention.

FIG. 4 shows an alternative configuration of a tile capable of inter-digitiated pixels, with the advantage that the edge tab at one corner is connected by more material.

Applicants have conducted tests with human subjects simulating a tiled display device according to the present invention, on a CRT display that have shown that an inter-digitated edge between tiles increases by as much as fifty percent the threshold at which a global uniformity difference between the tiles is perceptible and reduces the visibility of an edge seam by as much as 50%. Each tile in a multi-tile device according to the present invention has a complementary pattern on opposite edges 24 and 26 so that the tiles can be placed together with inter-digitated pixels along the edges. Tiles on the edges of a multi-tile device will not have a straight edge and pixels will be missing on the edge rows or columns. The edges can be masked with a frame to obscure the non-linear external edges. Alternatively, special edge and corner tiles may be created with one or more conventional straight edges.

The pixel control mechanisms for the tiles need not be modified and the row and column controls normally present in a device may operate normally, although pixels will be missing. In a display device, each tile's information overlaps with the neighboring tiles so that neighboring tiles will have edge rows and edge columns of information in common. Referring to FIG. 3, adjacent tiles overlap by one column or row of pixels 44. This reduces the total number of rows and columns in the entire display by the total overlap amount.

Figure 5:
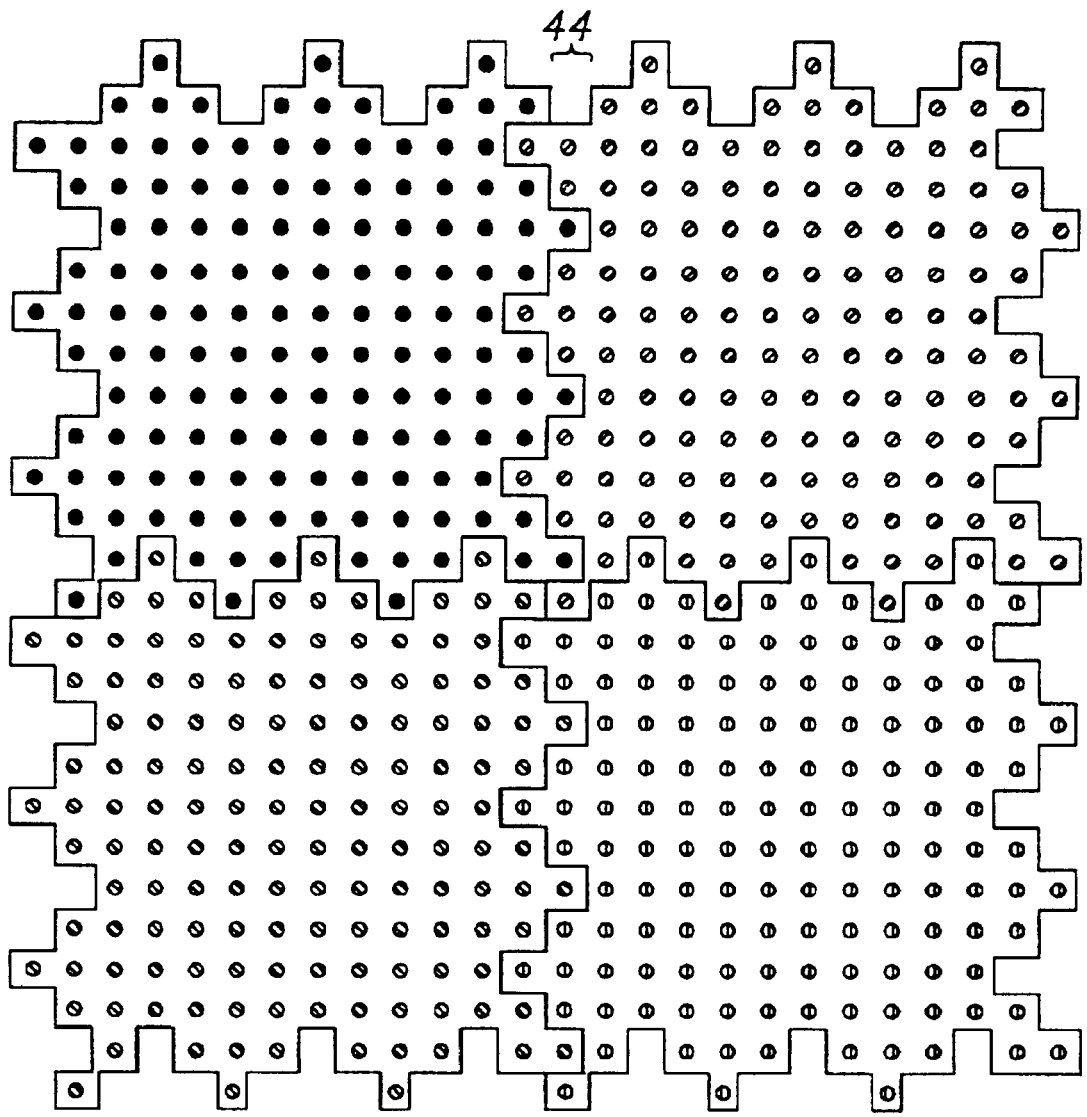
FIG. 5 is a schematic diagram of a tiled electro-optic imaging device according to an alternative embodiment of the present invention.

A variety of tile edge shapes may be used. Deeper stair steps that are multiple pixels deep may be used, as shown in FIG. 5. Referring to FIG. 5, the tiles incorporate a stair-step edge that overlaps by two columns or rows of pixels 44. The process may be extended to larger overlaps with improved seam-hiding and apparent tile uniformity but at the cost of more overlapped rows or columns.

Figure 6:
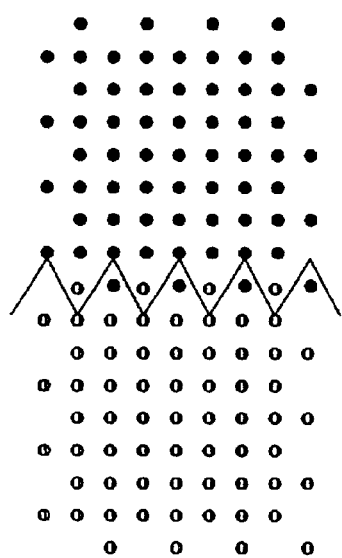
FIG. 6 is a schematic diagram showing a tile edge according to a further embodiment of the present invention.
Figure 7:
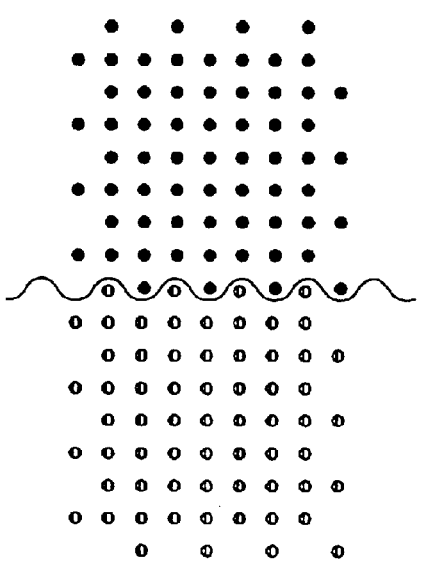
FIG. 7 is a schematic diagram showing a tile edge according to a still further embodiment of the present invention.
Figure 8:
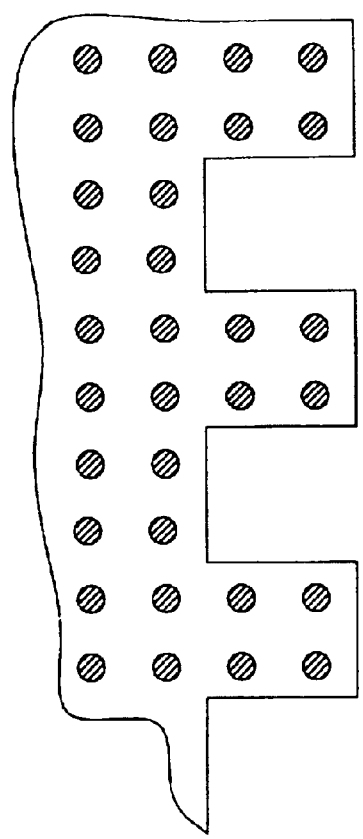
FIG. 8 is a schematic diagram showing a tile edge according to a still further embodiment of the present invention.

Alternative edge shapes can be employed with the same edge pixel arrangements. For example, FIGS. 6 and 7 illustrate tile edges that are triangular and sinusoidal, respectively. All of these physical shapes and others can accommodate a stair step pixel arrangement. The period of the inter-digitation can also be greater than one row or column of pixels as shown in FIG. 8.

Figure 9:
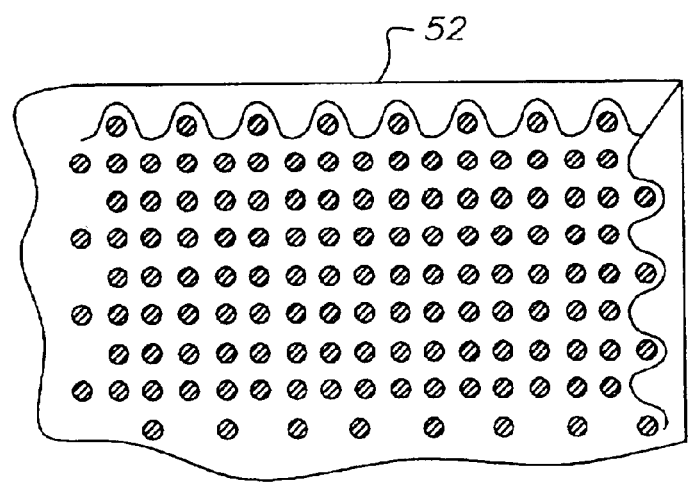
FIG. 9 is a schematic diagram illustrating the edge of a frame for holding tiles according to the present invention.

The non-linear edge shape can be complemented at the edge of the display in a frame 52 designed to hold the array of tiles, as illustrated in FIG. 9.

Figure 10:
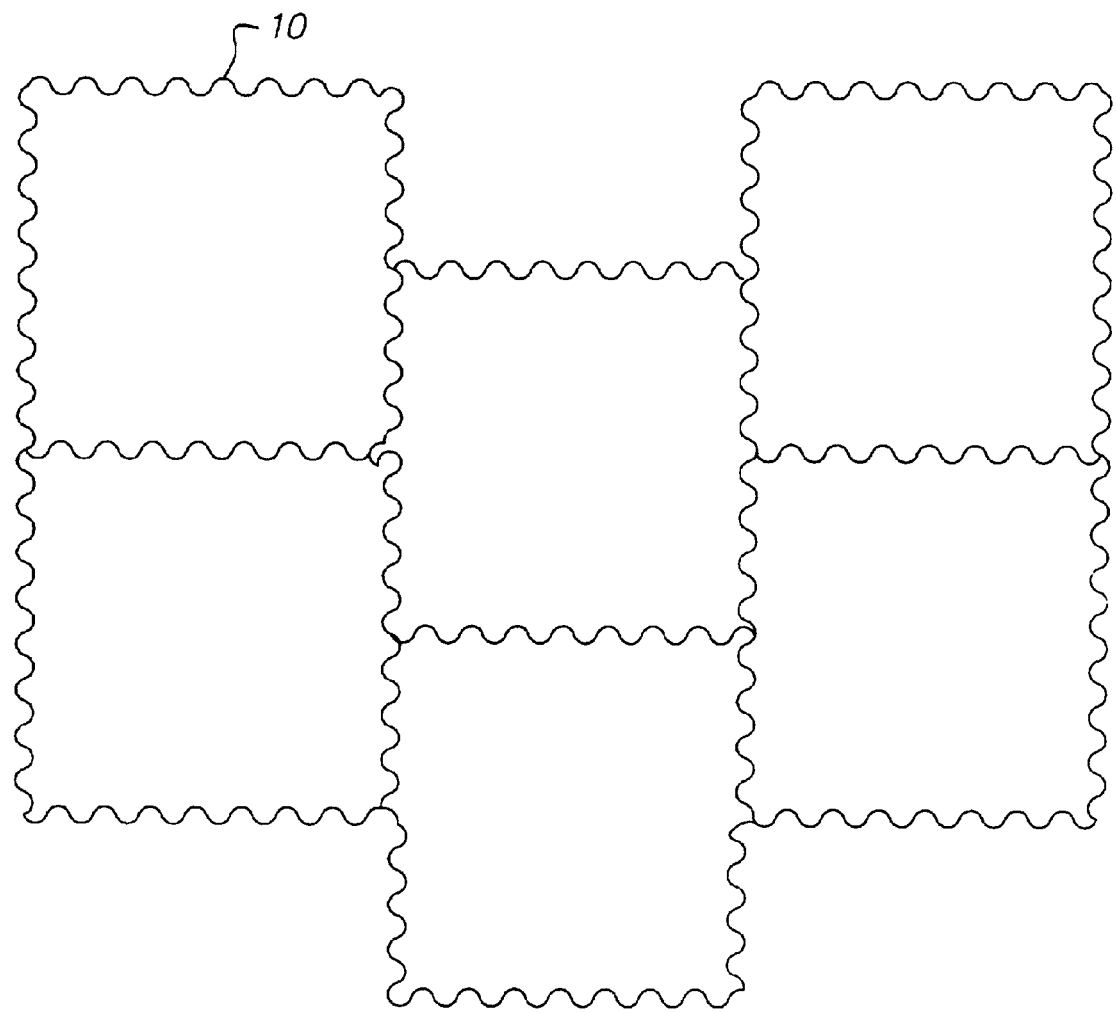
FIG. 10 is a schematic diagram showing tiles offset in a device according to the present invention.
Figure 11:
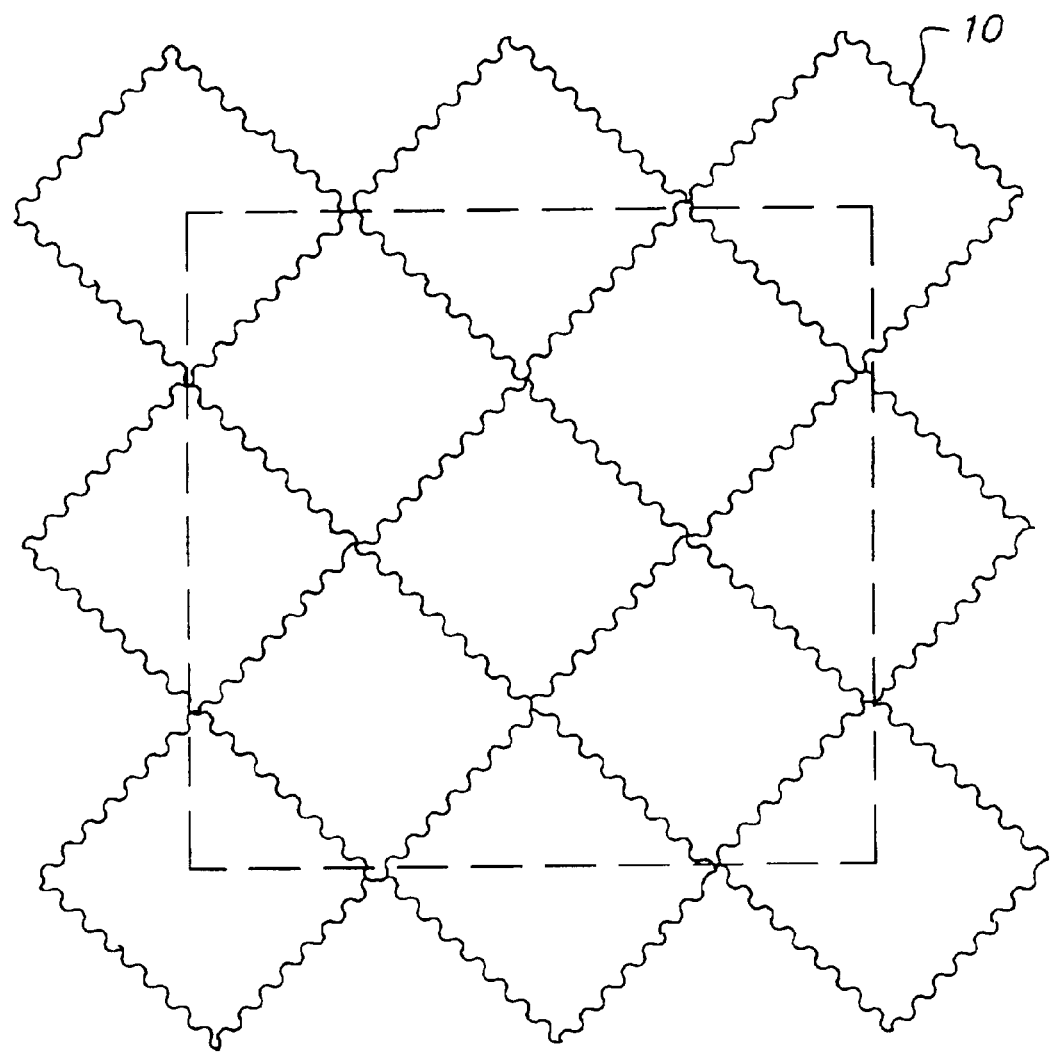
FIG. 11 is a schematic diagram showing tiles rotated 45 degrees in a device according to the present invention.

Referring to FIG. 10, the tiles in the device having nonlinear edges according to the present invention can be offset from each other to further obscure the tile seams. Referring to FIG. 11, the tiles can also be tilted such that the edges are not horizontal or vertical to further obscure the seams. For example the tiles can be tilted to 45 degrees as shown in FIG. 11.

Figure 12:
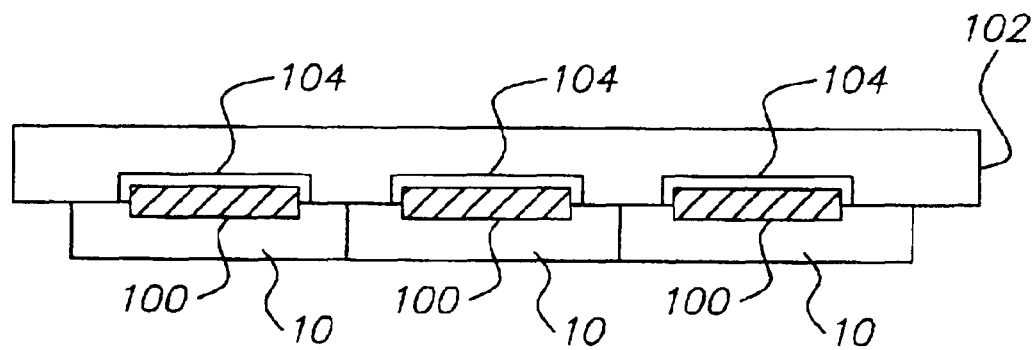
FIG. 12 is a schematic diagram showing a plurality of tiles assembled on a board according to the present invention.

Referring to FIG. 12, the tiles 10 include plugs 100 on their back sides that are electrically connected to conductors (not shown) on the tiles for addressing the pixels. The tiles 10 are mounted adjacent to each other on a circuit board 102 having an array of sockets 104 for removably receiving the plugs 100. Alternatively, the tiles 10 can be surface mounted on the circuit board 102 using known surface mounting techniques.

Figure 13:
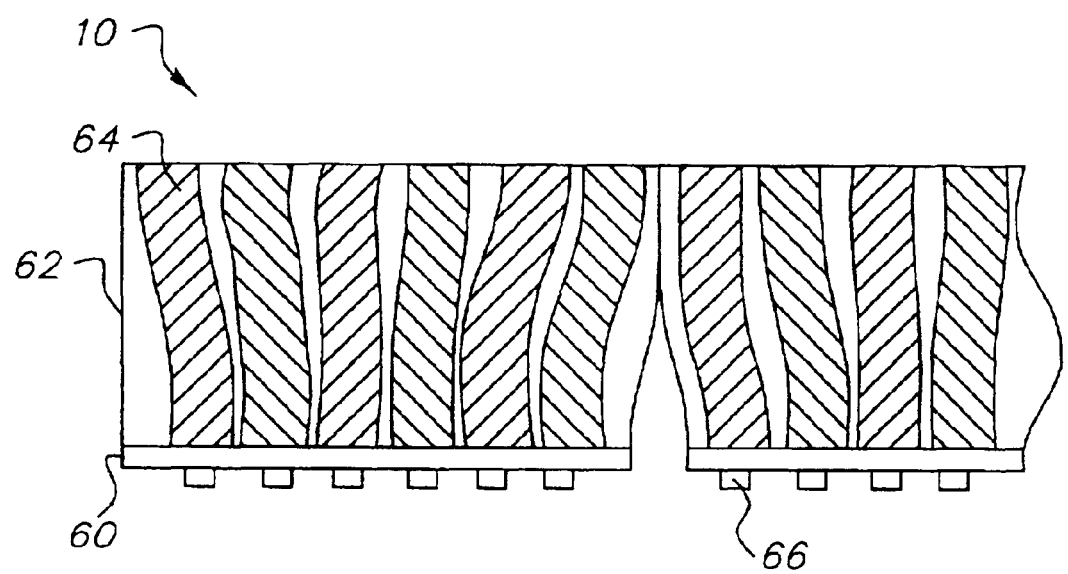
FIG. 13 is a schematic diagram of a device according to the present invention having tiles with image expanding fiber optic face plates.

In the embodiments discussed above, the tiles 10 included a substrate on which the pixels 16 were formed, and the edges of the substrates were non-linear and inter-digitated in the assembled device. Alternatively, the tiles 10 can be constructed conventionally with straight sides, and the pixels at the edges of the tiles can be inter-digitated using an image expanding fiber optic face plate. FIG. 13 shows a side view of the tile 10 having a substrate 60 and a fiber optic face plate 62. The fiber optic face plate includes a plurality of optical fibers (or light pipes) 64 (one or more per pixel 66). The fiber optic face plate 62 expands the apparent x and y dimensions of the underlying substrate as viewed from the side of the face plate farthest from the substrate. The tiles having fiber optic face plates are arranged side by side so that the outside edges of the face plates are immediately adjacent each other, leaving space between the underlying substrates to accommodate mounting and electronics.

In one embodiment, as shown in FIG. 13, the fibers 64 are of uniform diameter, and the area between the fibers is filled with an opaque filler, such as black epoxy. One method for constructing such a fiber optic face plate is to hold both ends of the fibers in a fixture that determines their final location and potting them in place with the epoxy. Alternatively, the fibers can be tapered, with their narrow ends adjacent the pixels and the wide ends at the outside surface of the fiber optic face plate.

Figure 14:
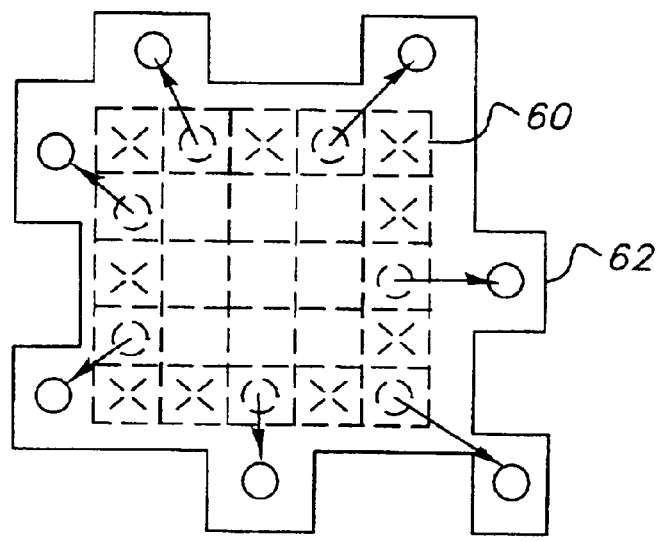
FIG. 14 is a schematic diagram showing the outline of the fiber optic face plate shown in FIG. 13.

FIG. 14 is a schematic diagram illustrating the outline of the substrate 60 and the outline of the fiber optic face plate 62 as seen from above, showing the non-linear edges of the fiber optic plate and the underlying straight edged substrate (shown by dotted lines). The apparent locations of the underlying edge pixels at the top surface of the image expanding fiber optic face plate are shown by circles with lines coming from the underlying locations of the pixels on the substrate shown by circles with dotted lines. The edge pixels marked with x's are not used. The device is operated by ignoring the pixels with x's. In the case of a display, the unused pixels can be driven, or not. In the case of an image sensor, the signals from the unused pixels at the edges are ignored. In driving the tiled display having the image expanding fiber optic face plate, the image signals applied to the tiles 10 are treated as if the tiles overlap by one or more pixels along adjoining edges.

Figure 15:
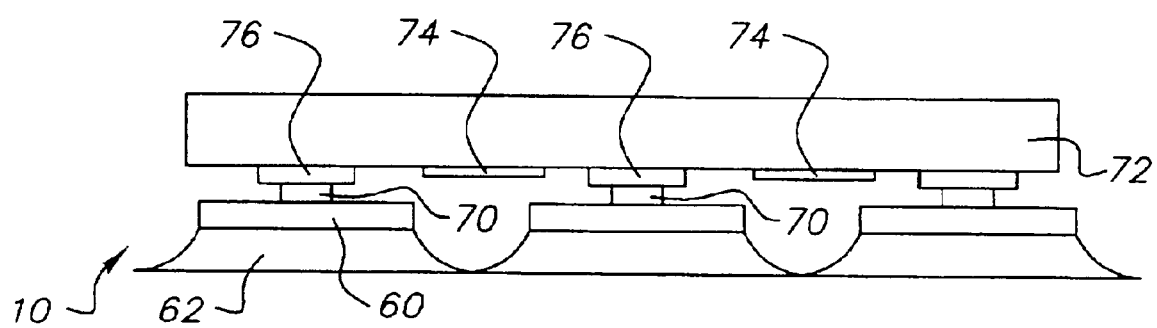
FIG. 15 is a schematic diagram showing a plurality of tiles in a display.

Referring to FIG. 15, electrical connection to the tiles is provided by multiple conductors 70 on the back sides of the tiles 10, and the individual tiles 10 are mounted on a circuit board 72. The circuit board 72 may include interface circuits 74 and connectors 76 for electrical connection between the tiles and the interface circuits. In a preferred embodiment, the device is an OLED display device, each tile having an encapsulating cover over the back side of the substrate, and the multiple conductors 70 may comprise a flex cable attached to the substrate 60 and the encapsulating cover is attached to the circuit board 72.

The invention has been described in detail with particular reference to certain preferred embodiments thereof, but it will be understood that variations and modifications can be effected within the spirit and scope of the invention.

PARTS LIST 8 electro-optic imaging device
10 tile
12 seam
14 edge
16 array of pixels
24 tile edge
26 tile edge
44 overlapping column or row
52 frame
60 substrate
62 fiber optic face plate
64 fiber
66 pixel
70 multiple conductor
72 circuit board
74 interface circuits
76 connectors
100 plug
102 circuit board
104 socket

What is claimed is:

1. A tiled electro-optic imaging device, comprising: two or more tiles, each tile having a two dimensional array of pixels and at least one non-linear edge, the non-linear edges of the tiles being aligned edge to edge such that pixels along the non-linear edge of one tile are inter-digitated with pixels along a complementary non-linear edge of an adjacent tile, whereby the visibility of the non-linear edge is reduced and the visual uniformity of the device is enhanced.

2. The device claimed in claim 1, wherein the pixels are light sensing elements and the device is an image sensor.

3. The device claimed in claim 1, wherein the pixels are light emitting elements and the device is an image display device.

4. The device claimed in claim 3, wherein the display device is a digital emissive flat-panel display.

5. The device claimed in claim 4, wherein the display device is an OLED display device.

6. The device claimed in claim 1, wherein the pixels are inter-digitated by more than one pixel.

7. The device claimed in claim 1, wherein the non-linear edges are sinusoidal.

8. The device claimed in claim 1, wherein the edges are saw-tooth shaped.

9. The device claimed in claim 1, wherein the edges are step-shaped.

10. The device claimed in claim 9, wherein the steps are inter-digitated periodically by more than one step.

11. The device claimed in claim 1, wherein each tile comprises a substrate, the array of pixels being formed on the substrate, and one or more edges of the substrate define the non-linear edge.

12. The device claimed in claim 1, wherein each tile comprises a substrate, the array of pixels being formed on the substrate, and an image expanding fiber optic face plate having at least one fiber per pixel; and one or more edges of the fiber optic face plate define the non-linear edge.

13. The device claimed in claim 1, wherein the tiles are rectangular and arranged in aligned rows and columns.

14. The device claimed in claim 1, wherein the tiles are rectangular and are arranged in slanted rows and columns.

15. The device claimed in claim 1, wherein the tiles are rectangular and are arranged in rows and columns slanted at 45 degrees.

16. A method of making a tiled electro-optic imaging device, comprising the steps of: providing a plurality of tiles, each tile having a two dimensional array of pixels and at least one non-linear edge, and arranging the non-linear edges of the tiles edge to edge such that pixels along the non-linear edge of one tile are inter-digitated with pixels along a complementary non-linear edge of an adjacent tile, whereby the visibility of the non-linear edge is reduced and the visual uniformity of the device is enhanced.

17. The method claimed in claim 16, wherein the pixels are light sensing elements and the device is an image sensor.

18. The method claimed in claim 16, wherein the pixels are light emitting elements and the device is an image display device.

19. The method claimed in claim 18, wherein the display device is a digital emissive flat-panel display.

20. The method claimed in claim 19, wherein the display device is an OLED display device.

21. The method claimed in claim 16, wherein the pixels are inter-digitated by more than one pixel.

22. The method claimed in claim 16, wherein the non-linear edges are sinusoidal.

23. The method claimed in claim 16, wherein the edges are saw-tooth shaped.

24. The method claimed in claim 16, wherein the edges are step-shaped.

25. The method claimed in claim 24, wherein the steps are inter-digitated periodically by more than one step.

26. The method claimed in claim 16, wherein each tile comprises a substrate, the array of pixels being formed on the substrate, and one or more edges of the substrate define the non-linear edge.

27. The method claimed in claim 16, wherein each tile comprises a substrate, the array of pixels being formed on the substrate, and an image expanding fiber optic face plate having at least one fiber per pixel; and one or more edges of the fiber optic face plate define the non-linear edge.

28. The method claimed in claim 16, wherein the tiles are rectangular and arranged in aligned rows and columns.

29. The method claimed in claim 16, wherein the tiles are rectangular and are arranged in an offset rows and columns.

30. The method claimed in claim 16, wherein the tiles are rectangular and are arranged in slanted rows and columns.

* * * * *